(12) United States Patent
Smith et al.

(10) Patent No.: US 11,309,880 B2
(45) Date of Patent: Apr. 19, 2022

(54) HIGH-PERFORMANCE CURRENT-LIMITED PYROTECHNIC INITIATOR DRIVE CIRCUITS

(71) Applicant: The Boeing Company, Chicago, IL (US)

(72) Inventors: Gregory Harris Smith, Placentia, CA (US); Kenneth A. Seidner, Fountain Valley, CA (US)

(73) Assignee: The Boeing Company, Chicago, IL (US)

( * ) Notice: Subject to any disclaimer, the term of this patent is extended or adjusted under 35 U.S.C. 154(b) by 1145 days.

(21) Appl. No.: 15/849,648

(22) Filed: Dec. 20, 2017

(65) Prior Publication Data

US 2019/0190510 A1 Jun. 20, 2019

(51) Int. Cl.
| | |
|---|---|
| *H03K 17/082* | (2006.01) |
| *H02H 3/10* | (2006.01) |
| *F41G 7/00* | (2006.01) |
| *F42C 15/40* | (2006.01) |
| *F42D 1/05* | (2006.01) |

(52) U.S. Cl.
CPC ......... *H03K 17/0822* (2013.01); *F41G 7/007* (2013.01); *F42C 15/40* (2013.01); *F42D 1/05* (2013.01); *H02H 3/105* (2013.01)

(58) Field of Classification Search
CPC .......... F41G 7/007; F42C 15/40; F42C 15/42; F42D 1/045; F42D 1/05; F42D 1/055; H01H 1/0036; H01H 2071/008; H01H 59/0009; H01H 9/54; H01H 9/541; H01H 9/542; H02H 3/105; H03K 17/082; H03K 17/0822; H03K 17/0824; H03K 17/0826; H03K 17/0828
See application file for complete search history.

(56) References Cited

U.S. PATENT DOCUMENTS

| | | | |
|---|---|---|---|
| 6,267,326 B1 | 7/2001 | Smith et al. | |
| 6,348,820 B1* | 2/2002 | Bennett | H03K 17/063 327/110 |
| 7,286,333 B2 | 10/2007 | Kubinski et al. | |
| 7,578,481 B2 | 8/2009 | Smith et al. | |
| 7,839,184 B2 | 11/2010 | Smith et al. | |
| 9,250,051 B1 | 2/2016 | Smith et al. | |
| 9,793,709 B2 | 10/2017 | Smith et al. | |
| 2008/0164961 A1* | 7/2008 | Premerlani | H01H 1/0036 335/7 |

(Continued)

*Primary Examiner* — Jared Fureman
*Assistant Examiner* — Nicolas Bellido
(74) *Attorney, Agent, or Firm* — Duft & Bornsen, PC

(57) ABSTRACT

Embodiments described herein provides a low-complexity solution and current protection for a current driver that provide current pulses to pyrotechnic initiators. The current drivers include current limiters that prevent high current transients during a current pulse. Further, a duration of the current pulse is controlled based on a thermal limit of the current driver to prevent thermal damage to the current driver. One embodiment comprises an apparatus that includes a control circuit and a current driver. The current driver is electrically couplable to a pyrotechnic initiator. The current driver includes a power switch circuit electrically coupled to a supply rail that supplies a current to a high side of the pyrotechnic initiator in response to receiving a drive signal from the control circuit.

20 Claims, 7 Drawing Sheets

(56) References Cited

U.S. PATENT DOCUMENTS

2008/0165457 A1* 7/2008 Premerlani ........ H01H 59/0009
361/31
2016/0094025 A1* 3/2016 Smith .................... H02M 1/32
323/271

* cited by examiner

HIGH-PERFORMANCE CURRENT-LIMITED PYROTECHNIC INITIATOR DRIVE CIRCUITS

STATEMENT REGARDING FEDERALLY SPONSORED RESEARCH OR DEVELOPMENT

This invention was made with Government support under NNM07AB03C awarded by NASA. The government has certain rights in this invention.

FIELD

This disclosure relates to the field of electronic circuits that provide current to pyrotechnic loads.

BACKGROUND

Current drivers can be used to provide current for a variety of loads including valves, motors, explosive charges, lighting, resistive loads, etc. Often, current drivers are utilized in various space or military applications such as missiles, manned or unmanned propulsion vehicles, launch vehicles, and spacecraft. In these applications, current drivers may provide a current pulse to fire initiators (e.g., NASA Standard Initiators (NSIs) used for pyrotechnic fasteners), fire electronic explosive devices (e.g., squibs, ordnance), etc. Pyrotechnic initiator current drivers are often simple designs that typically do not react well to a wide range of operating parameters (i.e. input voltage range and output load impedance), or they may involve complex and bulky design solutions in order to achieve the required operating performance over a wide range of operating conditions. For example, NSIs may impose operating criteria that includes loads that may go from nearly a short circuit up to several ohms. The challenge is to provide a current-limited pyrotechnic initiator firing circuit solution that occupies a small real estate footprint, with low complexity yet robust performance to be able to operate over a wide input voltage range, wide load range (even with a shorted load), and wide range of wire harness lengths (and associated line loss).

SUMMARY

Embodiments described herein provides a low-complexity solution and current protection for a current driver that provide current pulses to pyrotechnic initiators. The current drivers include current limiters that prevent high current transients during a current pulse. Further, a duration of the current pulse is controlled based on a thermal limit of the current driver to prevent thermal damage to the current driver.

One embodiment comprises an apparatus that includes a control circuit and a current driver. The current driver is electrically couplable to a pyrotechnic initiator. The current driver includes a power switch circuit electrically coupled to a supply rail that supplies a current to a high side of the pyrotechnic initiator in response to receiving a drive signal from the control circuit. The current driver further includes a current sense circuit that monitors the current to the pyrotechnic initiator, and modifies the drive signal applied to the power switch circuit to limit the current to a threshold current. The control circuit, in response to receiving a command to apply the current to the pyrotechnic initiator, generates the drive signal, determines whether a pre-determined time limit has expired for supplying the current, the pre-determined time limit based on the thermal limit of the power switch circuit, and terminates the drive signal in response to the pre-determined time limit expiring.

Another embodiment comprises a method for limiting a pulse duration of current supplied to a pyrotechnic initiator. The method comprises receiving a command to apply a current to the pyrotechnic initiator, and generating a drive signal for a power switch circuit of the current driver in response to receiving the command. The method further comprises supplying, by the power switch circuit in response to the drive signal, a current from a supply rail to a high side of the pyrotechnic initiator. The method further comprises monitoring the current to the pyrotechnic initiator, and modifying the drive signal for the power switch circuit to limit the current to a threshold current. The method further comprises determining whether a pre-determined time limit has expired for supplying the current, the pre-determined time limit based on a thermal limit of the power switch circuit, and terminating the drive signal in response to the pre-determined time limit expiring.

Another embodiment comprises a pyrotechnic firing device. The pyrotechnic firing device includes a current driver and a control circuit. The current driver is electrically couplable to a pyrotechnic initiator, and provides a current-limited current flow to fire the pyrotechnic initiator in response to receiving a drive signal. The current driver further terminates the current-limited current flow to the pyrotechnic initiator in response to not receiving the drive signal. The control circuit, in response to receiving a firing command to fire the pyrotechnic initiator, provides the drive signal to the current driver, determines whether a pre-determined time limit has expired for supplying the current-limited current, the pre-determined time limit based on a thermal limit of the current driver, and terminates the drive signal in response to the pre-determined time limit expiring.

The features, functions, and advantages that have been discussed can be achieved independently in various embodiments or may be combined in yet other embodiments, further details of which can be seen with reference to the following description and drawings.

DESCRIPTION OF THE DRAWINGS

Some embodiments are now described, by way of example only, and with reference to the accompanying drawings. The same reference number represents the same element or the same type of element on all drawings.

DETAILED DESCRIPTION

The figures and the following description illustrate specific exemplary embodiments. It will be appreciated that those skilled in the art will be able to devise various arrangements that, although not explicitly described or shown herein, embody the principles described herein and are included within the contemplated scope of the claims that follow this description. Furthermore, any examples described herein are intended to aid in understanding the principles of the disclosure, and are to be construed as being without limitation. As a result, this disclosure is not limited to the specific embodiments or examples described below, but by the claims and their equivalents.

Figure 1:
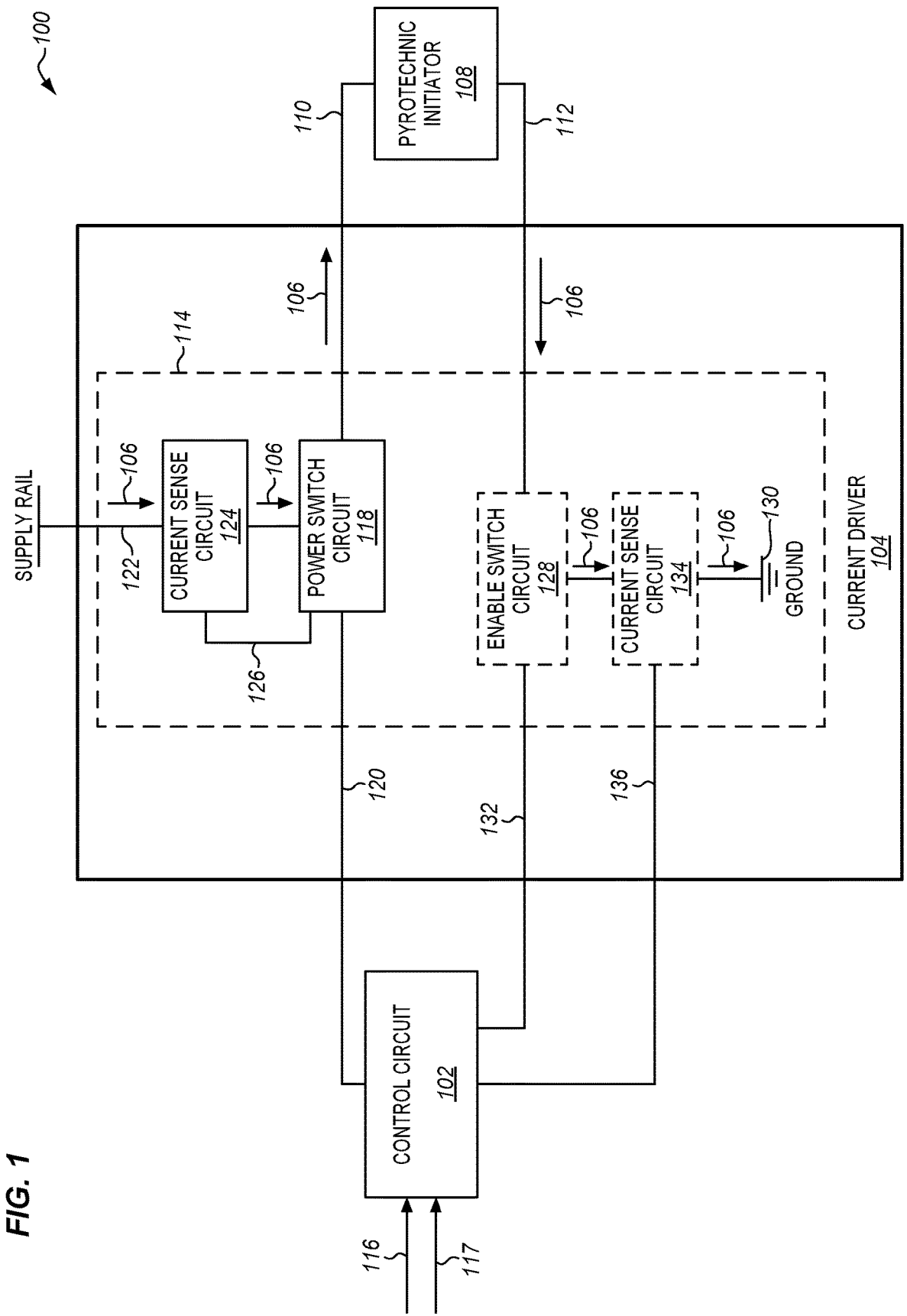
FIG. 1 is a block diagram of an apparatus that supplies transient current pulses to pyrotechnic initiators in an illustrative embodiment.

FIG. 1 is a block diagram of an apparatus 100 that supplies transient current pulses to pyrotechnic initiators in an illustrative embodiment. In this embodiment, apparatus 100 includes a control circuit 102 that coordinates the activities of a current driver 104. Current driver 104 supplies a current 106 to a pyrotechnic initiator 108. Generally, apparatus 100 is capable of controlling a duration of current 106 (e.g., the width of the current pulse) and the peak value of current 106 (e.g., the current limit of the current pulse) to prevent current damage and/or thermal damage to current driver 104. In this embodiment, pyrotechnic initiator 108 is illustrated as a two-terminal device. In particular, pyrotechnic initiator 108 is illustrated as having a high side 110 and a low side 112. Generally, high side 110 of pyrotechnic initiator 108 is electrically coupled to a power source, and low side 112 of pyrotechnic initiator 108 is electrically coupled to ground. Some examples of pyrotechnic initiator 108 include squibs (or initiators for squibs), ordnance (or initiators for ordnance), explosive charges (or initiators for explosive charges), NSIs, etc. For example, current driver 104 may be implemented in a manned or unmanned propulsion vehicle, launch vehicle, and/or a spacecraft in order to detonate explosive devices (e.g., NSIs coupled to frangible bolts that secure stages of a rocket together).

Although one current channel 114 is illustrated for current driver 104, current driver 104 may include a plurality of current channels as a matter of design choice. For instance, current driver 104 may include 8, 12, 16, or more current channels that may be operated independently by control circuit 102. In this regard, any additional current channels, although not shown in FIG. 1, include the functions and features described herein for current channel 114 of current driver 104. Further, current channel 114, control circuit 102, and any additional current channels implemented by current driver 104 may be implemented on a Printed Circuit Board (PCB) to enable apparatus 100 to be compact in size.

In this embodiment, control circuit 102 comprises any electronic circuits and/or optical circuits and/or magnetic circuits that are capable of performing functions. Some examples of control circuit 102 include Programmable Logic Devices (PLDs), Field Programmable Gate Arrays (FPGAs), Digital Signal Processors (DSPs), Processors (e.g., microcontrollers, Central Processing Units (CPUs)), discrete timing circuits, transceivers, Application Specific Integrated Circuits (ASICs), etc. In this embodiment, control circuit 102 initiates current 106 in response to a command 116 to apply current 106 to pyrotechnic initiator 108. Command 116 may comprise a signal from an external source (e.g., a spacecraft bus) to initiate current 106. For instance, command 116 may be received from a spacecraft bus to fire one or more NSIs to separate one stage of a rocket from another stage of the rocket by applying an explosive charge to frangible bolts.

In this embodiment, current driver 104 includes a power switch circuit 118 that is capable of providing current 106 to pyrotechnic initiator 108 in response to a drive signal 120 from control circuit 102. Power switch circuit 118 comprises any electronic circuits and/or optical circuits and/or magnetic circuits that are capable of initiating and terminating current 106 based on drive signal 120. For example, control circuit 102 may generate drive signal 120 to cause power switch circuit 118 to supply current 106, and control circuit 102 may terminate drive signal 120 to cause power switch circuit 118 to terminate current 106.

Power switch circuit 118 may include one or more transistors, such as a Field Effect Transistor (FET). Some examples of FETs include N-channel Metal Oxide Semiconductor FETs (MOSFETs) and P-channel MOSFETS. In this embodiment, power switch circuit 118 is electrically coupled to a supply rail 122, which provides a power source for current 106.

Although not shown in FIG. 1, drive signal 120 may include level shifters, opto-isolators, and/or additional circuits along the signaling path from control circuit 102 to power switch circuit 118 that are based on the particular circuit implementation of current driver 104. For instance, if power switch circuit 118 includes one or more N-channel FETs that controllably apply current 106 to high side 110 of pyrotechnic initiator 108, then additional boost circuits may be included along the signaling path for drive signal 120 to generate a gate-to-source signal on the N-channel FETs that is higher than the voltage of supply rail 122. However, if power switch circuit 118 comprises one or more P-channel FETs that controllably apply current 106 to high side 110 of pyrotechnic initiator 108, then additional circuits may be included along the signaling path for drive signal 120 to generate a gate-to-source signal on the P-channel FETs that is lower than the voltage of supply rail 122.

Current driver 104 in this embodiment further includes a current sense circuit 124. Current sense circuit 124 comprises any electronic circuits and/or optical circuits and/or magnetic circuits that are capable of sensing and/or measuring current 106 and modifying drive signal 120 to limit current 106 to a threshold current. For instance, if current sense circuit 124 is configured to limit current 106 to five amps, then current sense circuit 124 may modify drive signal 120 applied to power switch circuit 118 (e.g., via a signal path 126) to ensure that current 106 does not exceed five amps, regardless of whether the resistance of pyrotechnic initiator 108 is zero (e.g., shorted) or the resistance of pyrotechnic initiator 108 is a non-zero value. This may be useful in cases whereby the resistance of pyrotechnic initiator 108 varies over a wide range and/or the voltage of supply rail 122 varies. For example, firing a NSI may result in a short circuit across the NSI, which may cause a high transient current across power switch circuit 118 when current 106 is applied to the NSI. This high transient current may cause damage to power switch circuit 118, which is potentially detrimental to the performance of other current channels implemented by current driver 104. In another example, supply rail 122 may be supplied by a voltage bus that is unregulated, which would cause current 106 to vary unless current 106 was current limited.

In addition to mitigating the effects of a high current transient, control circuit 102 is further capable of limiting a thermal transient of power switch circuit 118 by controlling a pulse width or pulse duration of current 106. For example, when supplying current 106 to pyrotechnic initiator 108, the implementation of power switch circuit 118 may preclude continuous operation due to thermal limits of power switch circuit 118. For example, the active power elements of power switch circuit 118 may be surface mounted onto a PCB, which limits the power dissipation capabilities of the active power elements. Thus, control circuit 102 is configured in this embodiment to manage a pulse width of drive signal 120 applied to power switch circuit 118 based on the thermal performance of power switch circuit 118 while supplying current 106. For example, power switch circuit 118 may operate one or more FETs in a linear mode to provide a current limit for current 106, which may result in rapid heating of the FETs. The FETs may be damaged or destroyed within a few hundred milliseconds, which is obviously undesirable. Therefore, control circuit 102 may be configured to limit the pulse width of current 106 to about 25 milliseconds depending on the pre-configured current limit of current 106, and/or a number of additional factors such as the resistance of pyrotechnic initiator 108, the voltage of supply rail 122, the thermal performance of the active power elements that implement power switch circuit 118, etc.

Although one instance of power switch circuit 118 and current sense circuit 124 are illustrated for current channel 114, other embodiments may include a plurality of instances of power switch circuit 118 and current sense circuit 124, each instance providing a portion of current 106. For example, multiple FETs may be individually controllable by their corresponding current sense circuit 124, with each FET supplying some subset of the total current supplied to pyrotechnic initiator 108. This may be desirable in some cases when the thermal load on a single FET is too great to support the desired output current for a current pulse applied to pyrotechnic initiator 108, and/or when the thermal load on a single FET is too great to support the desired pulse width of the current applied to pyrotechnic initiator 108. This type of current sharing arrangement allows each FET to carry a portion of the total thermal and current load imposed on current driver 104 when supplying current 106 to pyrotechnic initiator 108, while still allowing each FET to be individually controlled to limit the current through each of the FETs.

In some embodiments, current driver 104 may include an enable switch circuit 128 that is configured to selectively couple low side 112 of pyrotechnic initiator 108 to ground 130 based on an enable signal 132 from control circuit 102. For example, control circuit 102 may receive an enable command 117 from an external device (not shown in FIG. 1), which directs control circuit 102 to generate enable signal 132. Enable signal 132 causes enable switch circuit 128 to electrically couple low side 112 of pyrotechnic initiator 108 to ground 130, thereby providing a current path from low side 112 of pyrotechnic initiator 108 to ground 130. In response to not receiving enable command 117 (e.g., control circuit 102 receives a disable command), control circuit 102 may also terminate enable signal 132 to electrically decouple low side 112 of pyrotechnic initiator 108 from ground 130, thereby terminating the current path from low side 112 of pyrotechnic initiator 108 to ground 130. Enable switch circuit 128 comprises any electronic circuits and/or optical circuits and/or magnetic circuits that are capable of selectively coupling and decoupling low side 112 of pyrotechnic initiator 108 to ground 130 based on enable signal 132. Enable switch circuit 128 may include one or more transistors, FETs, MOSFETs, etc. Although not shown in FIG. 1, enable signal 132 may include level shifters, opto-isolators, and/or additional circuits along the signaling path from control circuit 102 to enable switch circuit 128 that are based on the particular circuit implementation of current driver 104.

In some embodiments, current driver 104 may include a current sense circuit 134, which is capable of sensing current 106 to ground 130 and providing a current sense signal 136 to control circuit 102. For instance, current sense circuit 134 may generate current sense signal 136 in response to current 106 from low side 112 of pyrotechnic initiator 108 to ground 130 exceeding a threshold current, which indicates to control circuit 102 that current 106 has been applied to pyrotechnic initiator 108. Current sense circuit 124 comprises any electronic circuits and/or optical circuits and/or magnetic circuits that are capable of sensing current 106 to ground 130, and generating current sense signal 136. Although not shown in FIG. 1, current sense signal 136 may include level shifters, opto-isolators, and/or additional circuits along the signaling path from current sense circuit 134 to control circuit 102 that are based on the particular circuit implementation of current driver 104.

Figure 2:
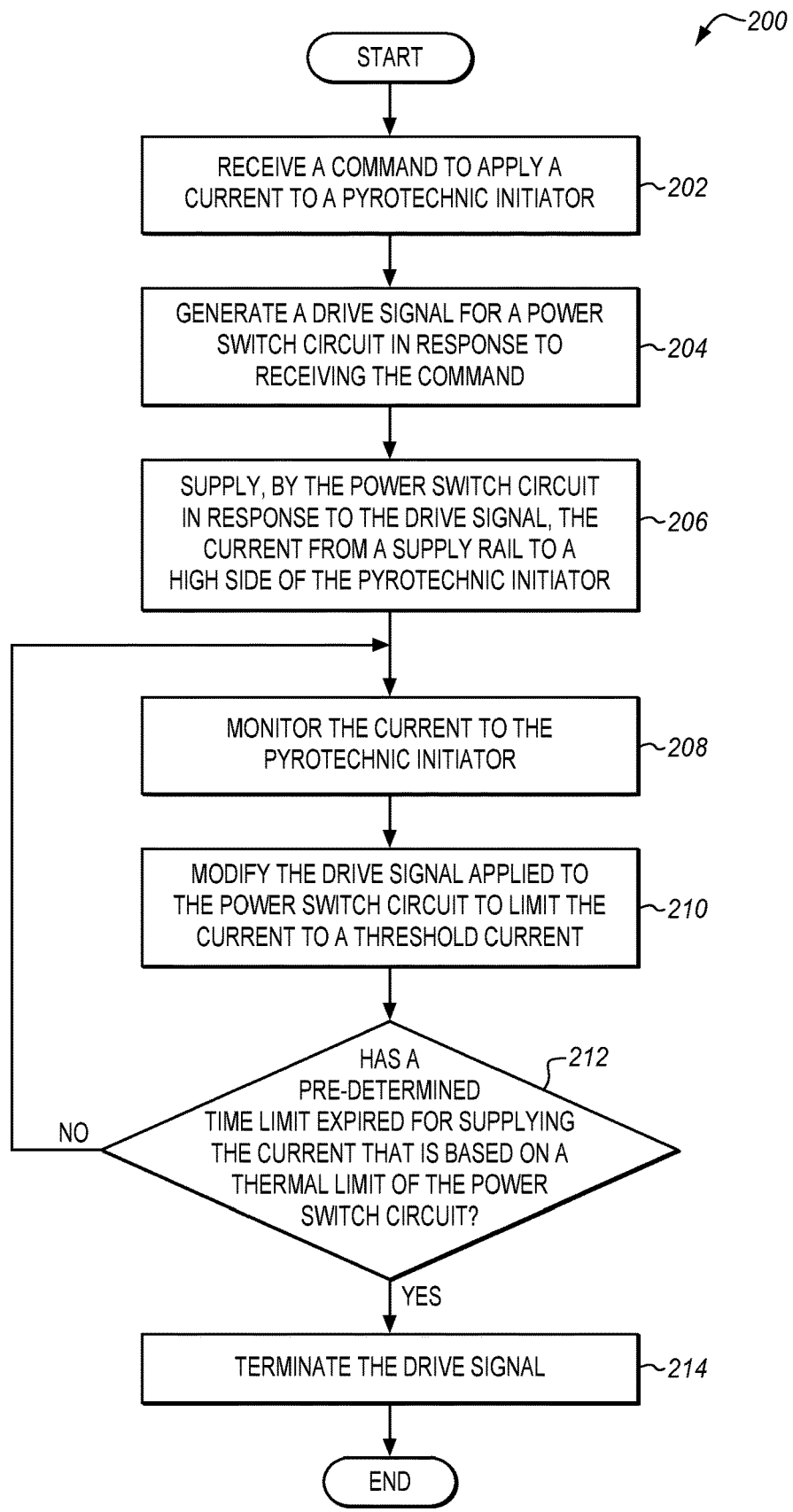
FIG. 2 is a flow chart of a method for a limiting a pulse duration of current supplied to a pyrotechnic initiator in an illustrative embodiment.

Consider that pyrotechnic initiator 108 is electrically coupled to current driver 104, and that apparatus 100 is in operation. FIG. 2 is a flow chart of a method 200 for limiting a pulse duration of current supplied to a pyrotechnic initiator in an illustrative embodiment. The steps of method 200 will be described with respect to apparatus 100 of FIG. 1; although one skilled in the art will understand that method 200 may be performed by other devices or systems not shown. The steps of method 200 are not all inclusive and may include other steps not shown. Further, the steps of method 200 may be performed in an alternate order.

Prior to receiving command 116, current driver 104 does not supply current 106 to pyrotechnic initiator 108. In particular, power switch circuit 118 is off or otherwise configured in a high impedance state. Enable switch circuit 128 (if implemented in current driver 104) is off or otherwise configured in a high impedance state. Current 106 to pyrotechnic initiator 108 is therefore approximately zero. Current sense circuit 134 (if implemented in current driver 104) indicates that current 106 to ground 130 is below the threshold current via current sense signal 136. At some point in time, control circuit 102 receives command 116 to apply current 106 to pyrotechnic initiator 108 (see step 202). For example, control circuit 102 may receive a command from a spacecraft bus to trigger one or more NSIs coupled to current driver 104. In response to receiving command 116, control circuit 102 generates drive signal 120, which is applied to power switch circuit 118 (see step 204).

In response to power switch circuit 118 receiving drive signal 120, power switch circuit 118 supplies current 106 from supply rail 122 to high side 110 of pyrotechnic initiator 108 (see step 206). For instance, power switch circuit 118 transitions from a high impedance state to a low impedance state in response to receiving drive signal 120, thereby effectively providing a low impedance path from supply rail 122 to high side 110 of pyrotechnic initiator 108.

Current sense circuit 124 monitors current 106 to high side 110 of pyrotechnic initiator 108 (see step 208). For example, current sense circuit 124 may monitor a voltage across a sense resistor (not shown in FIG. 1) to monitor current 106. Current sense circuit 124 modifies drive signal 120 (e.g., via signal path 126) applied to power switch circuit 118 to limit current 106 to a threshold current (see step 210). For instance, current sense circuit 124 may adjust drive signal 120 applied to power switch circuit 118 to ensure that current 106 is less than or equal to the threshold current. If, for example, drive signal 120 is a gate drive signal for a FET, then current sense circuit 124 may utilize signal path 126 to modify drive signal 120 to transition the FET from a saturation mode of operation to a linear mode of operation to limit current 106. When in the linear mode of operation, the channel of the FET operates at a higher resistance as compared to the saturation mode of operation. Thus, current sense circuit 124 may operate power switch circuit 118 as a variable resistor to limit current 106 to the threshold current. Current sense circuit 124 may operate as a closed-loop control system to monitor and modify drive signal 120 to limit current 106 to the threshold current, even though a pulse width of current 106 may be short (e.g., some tens of milliseconds). Thus, current sense circuit 124 may perform step 208 and step 210 repeatedly to enable closed-loop current control of current 106.

Control circuit 102 determines whether a pre-determined time limit for supplying current 106 has expired. In particular, the pre-determined time limit is based on a thermal limit power switch circuit 118 while supplying current 106 (see step 212). For instance, the thermal limit of power switch circuit 118 may be reached more quickly when pyrotechnic initiator 108 is a short circuit, when current 106 is at the current limit, and/or when the voltage of supply rail 122 is at its highest voltage (if the voltage of supply rail 122 varies). Calculations may be performed during the design phase of current driver 104 based on the current limit, the highest variable voltage of supply rail 122, and/or the assumption that pyrotechnic initiator 108 is a short circuit in order to determine the thermal load imposed on power switch circuit 118. Taking into account a margin of safety and the environmental conditions that current driver 104 operates in (e.g., a particular application that apparatus 100 is implemented in), a pre-determined time limit may be calculated that ensures that the thermal limit of power switch circuit 118 is avoided with margin, thereby preventing damage to power switch circuit 118 and/or current driver 104.

If the pre-determined time limit has not expired, then the execution of method 200 returns to step 208. If the pre-determined time limit has expired, then control circuit 102 terminates drive signal 120 applied to power switch circuit 118 (see step 214). The termination of drive signal 120 applied to power switch circuit 118 causes power switch circuit 118 to terminate current 106 to high side 110 of pyrotechnic initiator 108. For example, power switch circuit 118 may transition from a low impedance state to a high impedance state.

Figure 3:
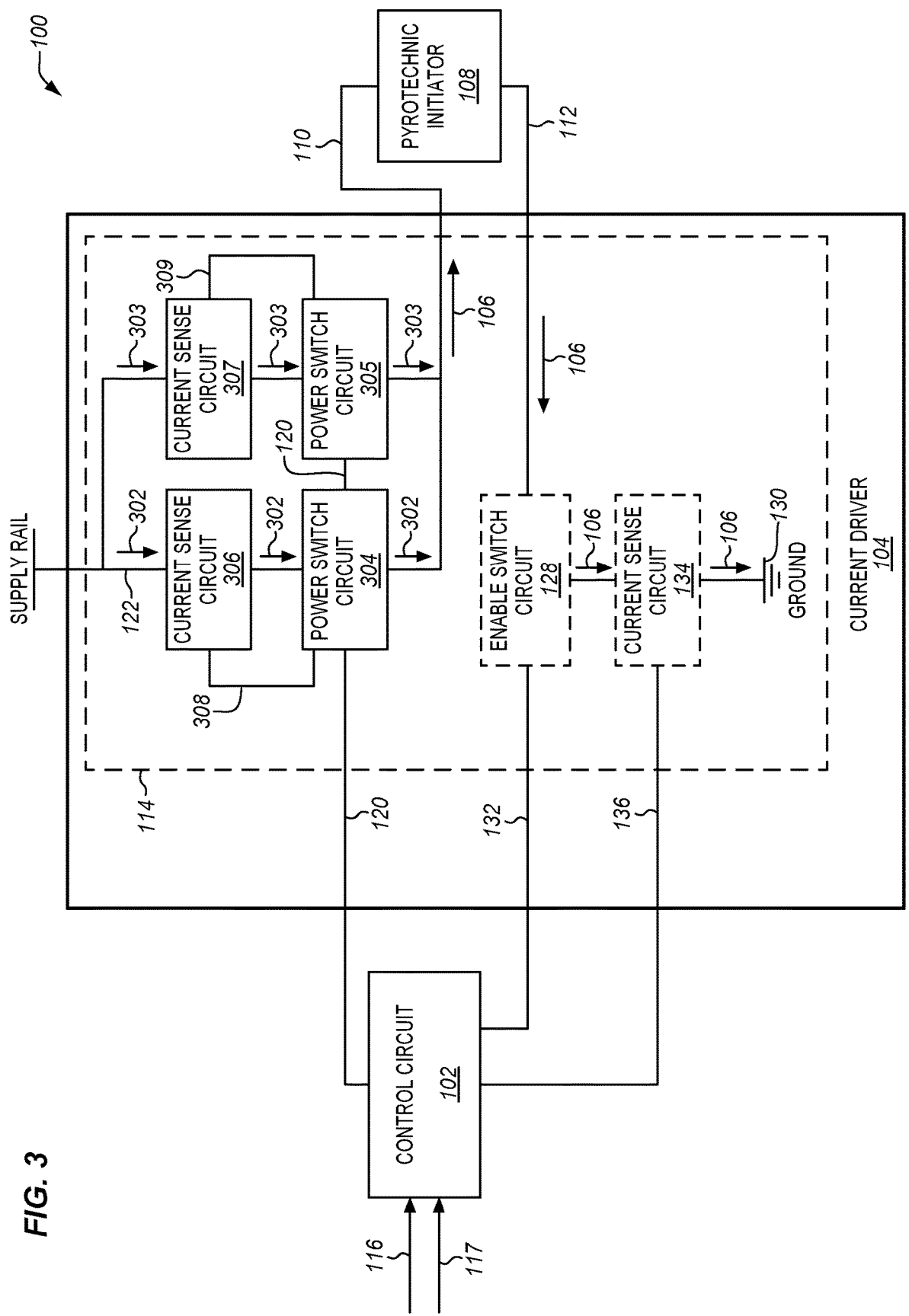
FIGS. 3-5 are block diagrams of the apparatus of FIG. 1 in other illustrative embodiments.

As discussed previously, some embodiments of current driver 104 may include multiple instances of power switch circuit 118 and current sense circuit 124. FIG. 3 is a block diagram of apparatus 100 in another illustrative embodiment. In this embodiment, current 106 is provided to pyrotechnic initiator 108 by aggregating a plurality of current sources together. In this embodiment, current 106 is the sum of currents 302-303. In particular, current 302 is provided by power switch circuit 304, and is sensed by current sense circuit 306. Current sense circuit 306 monitors current 302, and current limits current 302 to a threshold current by modifying drive signal 120 applied to power switch circuit 304 using a signal path 308.

In this embodiment, current 303 is provided by power switch circuit 305, and sensed by current sense circuit 307. Current sense circuit 307 monitors current 303, and current limits current 303 to a threshold current by modifying drive signal 120 applied to power switch circuit 305 using a signal path 309. In this embodiment, the current limit of current 302 and the current limit of current 303 are not necessarily the same value. Generally, the use of parallel current sources as illustrated in FIG. 3 allow for distributing the current load and thermal load among multiple current sources. For instance, a design specification for particular application may have a peak current, and/or a supply voltage and/or a current pulse width that is difficult to implement with one instance of power switch circuit 118 (see FIG. 1).

In some embodiments, an arming circuit may be used to selectively power supply rail 122. The use of an arming circuit may add another layer of protection. This additional layer of protection may be used to ensure that a NSI is not triggered accidently due to a transient condition in current driver 104. For example, in a launch vehicle or spacecraft application, current driver 104 may be subjected to temperature, vibration, and/or radiation environments which may accidentally trigger an application of current 106, which is undesirable. Using an arming circuit can ensure that supply rail 122 is not powered until just prior to firing a NSI or other explosive device.

Figure 4:
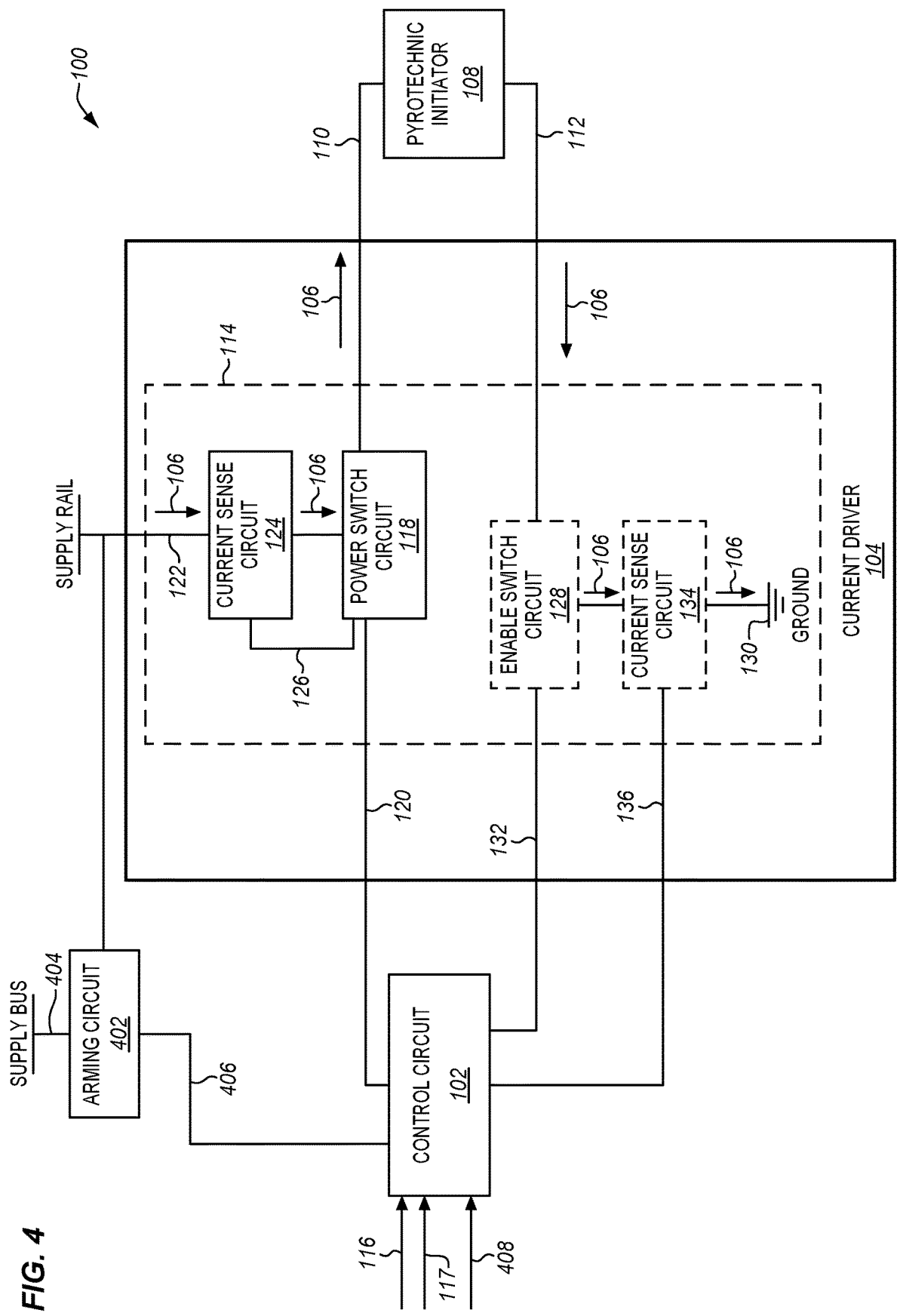

FIG. 4 is a block diagram of apparatus 100 in another illustrative embodiment. In this embodiment, an arming circuit 402 is utilized to selectively couple a supply bus 404 to supply rail 122 based on an arming signal 406 from control circuit 102. For example, control circuit 102 may receive an arm command 408 from an external device (not shown in FIG. 4). In response to receiving arm command 408, control circuit 102 may generate arming signal 406 to cause arming circuit 402 to electrically couple supply bus 404 to supply rail 122, thereby providing electrical power to supply rail 122. In response to not receiving arm command 408 (e.g., control circuit 102 receives a disarm command), control circuit 102 may also terminate arming signal 406 to electrically decouple supply bus 404 from supply rail 122, thereby removing the electrical power from supply rail 122. Arming circuit 402 comprises any electronic circuits and/or optical circuits and/or magnetic circuits that are capable of selectively coupling and decoupling supply bus 404 from supply rail 122 in response to arming signal 406. Arming circuit 402 may include one or more transistors, FETs, MOSFETs, etc. Although not shown in FIG. 4, arming signal 406 may include level shifters, opto-isolators, and/or additional circuits along the signaling path from control circuit 102 to arming circuit 402 that are based on the particular circuit implementation of current driver 104.

Figure 5:
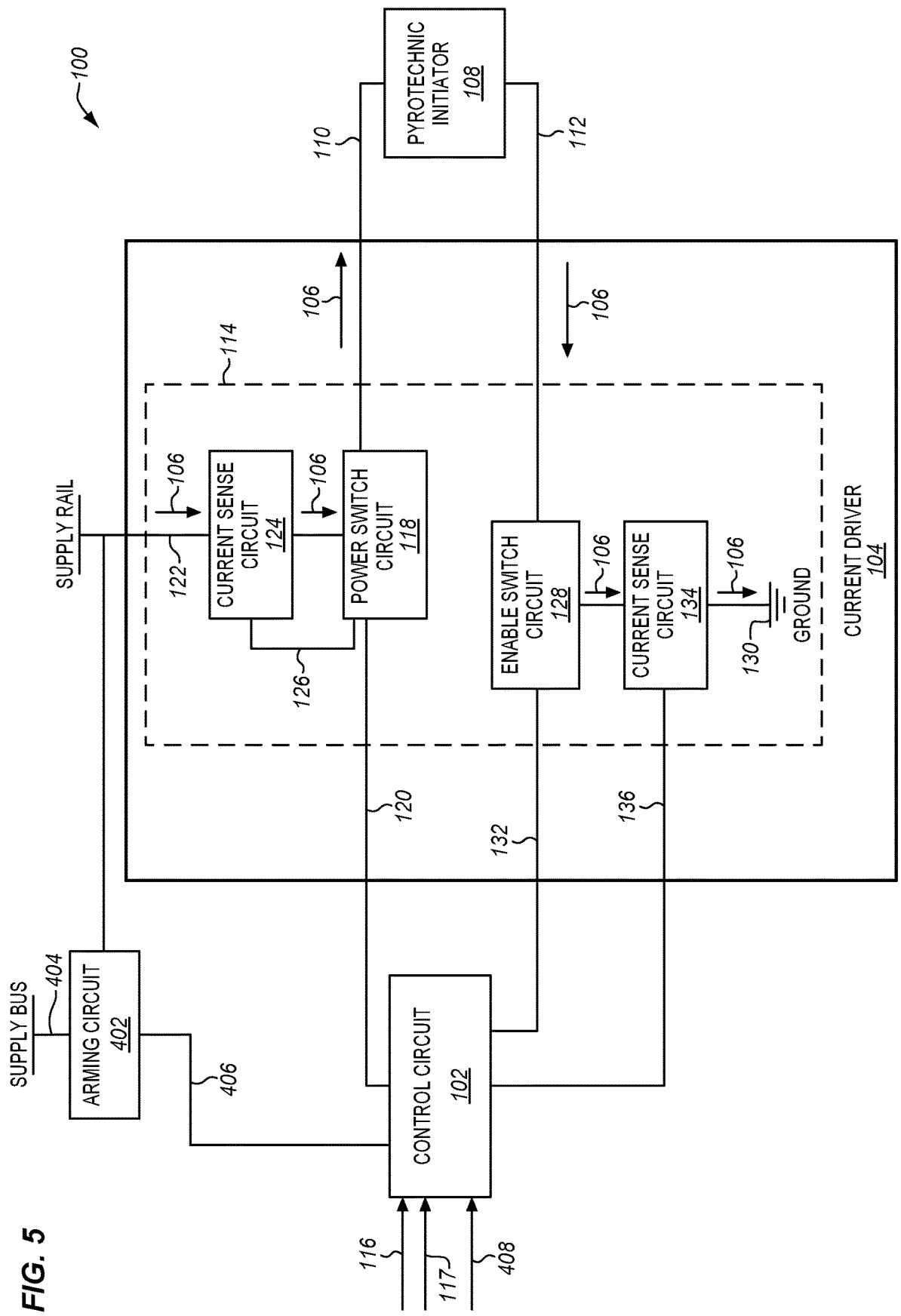

FIG. 5 is a block diagram of apparatus 100 in another illustrative embodiment. In this embodiment, apparatus 100 includes arming circuit 402, enable switch circuit 128, and current sense circuit 134. In this embodiment, current driver 104 is configured to fire pyrotechnic initiator 108 to detonate a pyrotechnic device. For example, pyrotechnic initiator 108 may comprise a NSI, an initiator for an ordinance, an initiator for an explosive charge, etc.

Consider that apparatus 100 is operational, and that current 106 is not being provided to pyrotechnic initiator 108. In this case, supply rail 122 is unpowered. Arming signal 406 is not being generated by control circuit 102, and arming circuit 402 is in a high impedance state. This prevents supply bus 404 from electrically coupling to supply rail 122. Drive signal 120 is not being generated by control circuit 102, and power switch circuit 118 is in a high impedance state. This prevents supply rail 122 from electrically coupling to high side 110 of pyrotechnic initiator 108. Enable signal 132 is not being generated by control circuit 102, and enable switch circuit 128 is in a high impedance state. This prevents low side 112 of pyrotechnic initiator 108 from electrically coupling to ground 130.

Figure 6:
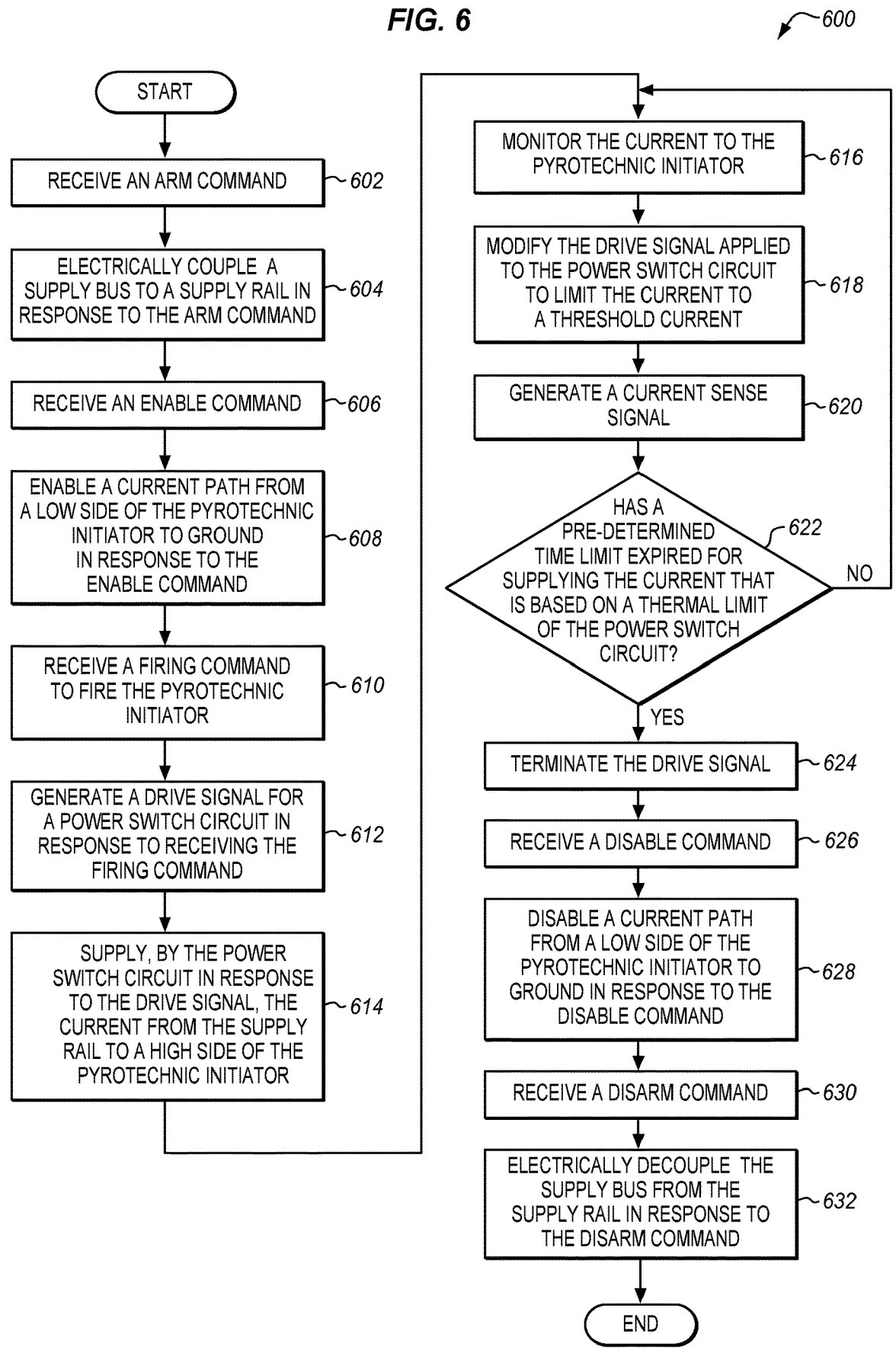
FIG. 6 is a flow chart of a method for firing a pyrotechnic initiator in an illustrative embodiment.

FIG. 6 is a flow chart of a method 600 for firing a pyrotechnic initiator in an illustrative embodiment. The steps of method 600 will be described with respect to apparatus 100 of FIG. 5; although one skilled in the art will understand that method 600 may be performed by other devices or systems not shown. The steps of method 600 are not all inclusive and may include other steps not shown. Further, the steps of method 600 may be performed in an alternate order.

Control circuit 102 receives arm command 408 (see step 602). In response to arm command 408, control circuit 102 generates arming signal 406. Arming signal 406 is applied to arming circuit 402, which transitions from a high impedance state to a low impedance state. When in the high impedance state, a current path from supply bus 404 and supply rail 122 is not present. When in the low impedance state, a current path from supply bus 404 to supply rail 122 is present. In response to receiving arming signal 406 supply bus 404 powers supply rail 122 with a voltage that is substantially equal to supply bus 404 (see step 604).

Control circuit 102 receives enable command 117 (see step 606). In response to enable command 117, control circuit 102 generates enable signal 132, which is applied to enable switch circuit 128. Enable switch circuit 128 enables a current path from low side 112 of pyrotechnic initiator 108 to ground 130 (see step 608). At this point, current 106 is still approximately zero since power switch circuit 118 is in a high impedance state.

Control circuit 102 receives command 116 (e.g., a firing command) to fire pyrotechnic initiator 108 (see step 610). For example, command 116 may be generated by a launch vehicle controller in order to start a separation sequence between different stages of the launch vehicle. Although one pyrotechnic initiator 108 and one current channel 114 are illustrated in FIG. 5, current driver 104 may include a plurality of current channels, each associated with a different pyrotechnic initiator. These additional current channels may be driven independently to sequence a firing of multiple pyrotechnic devices. Although the subsequent discussion describes the firing of one pyrotechnic device, the following discussion will also apply to the detonation of other pyrotechnic devices that are associated with different current channels of current driver 104.

In response to receiving command 116, control circuit 102 generates drive signal 120, which is applied to power switch circuit 118 (see step 612). Power switch circuit 118 transitions from a high impedance state to a low impedance state, and current 106 is supplied to high side 110 of pyrotechnic initiator 108 (see step 614). A slope of the current ramp depends upon a number of factors, including the inductance of the current path for current 106 and the voltage of supply bus 404. For instance, drive signal 120 may place a P-channel MOSFET of power switch circuit 118 in a saturation mode of operation, which results in a very low impedance channel through the P-channel MOSFET. In this mode, the resistance across the channel of the P-channel MOSFET is somewhere on the order of milliohms. The power dissipated by the P-channel MOSFET while in the saturation mode of operation is also very low (e.g., almost negligible).

Current sense circuit 124 monitors current 106 to pyrotechnic initiator 108 (see step 616). When current 106 approaches a value that is approximately the current limit, current sense circuit 124 modifies drive signal 120 to limit current 106 to the threshold current (see step 618). For instance, current sense circuit 124 may reduce the voltage of drive signal 120 using signal path 126 to transition the P-channel MOSFET from a saturation mode of operation to a linear mode of operation. When in the linear mode of operation, the resistance through the channel of the P-channel MOSFET varies based on the voltage of drive signal 120. This variation in the resistance is used to control the value of current 106. However, while in the linear mode of operation, significant power is dissipated by the P-channel MOSFET. For instance, firing pyrotechnic initiator 108 may result in a short circuit across initiator 502. The result is that power switch circuit 118 will see a very low impedance output. With the P-channel MOSFET in the linear mode and current 106 at the current limit, the P-channel MOSFET may be dissipating significant power (e.g., 200 watts or more). This amount of power dissipation is not sustainable for most applications, especially when the P-channel MOSFET is a surface mount device.

When current 106 from low side 112 of pyrotechnic initiator 108 to ground 130 exceeds a threshold value, current sense circuit 134 generates current sense signal 136 (see step 620). Current sense signal 136 indicates to control circuit 102 that current 106 is being applied to initiator 502. This type of information may be useful to identify faults. For instance, additional redundancy may be implemented by wiring pyrotechnic initiator 108 in parallel with additional current channels of current driver 104. Thus, if current channel 114 fails to supply current to pyrotechnic initiator 108, an alternate current channel may be used to fire pyrotechnic initiator 108 and detonate the pyrotechnic device.

To protect power switch circuit 118 from thermal damage, control circuit 102 limits the pulse width of current 106. Control circuit 102 determines whether a pre-determined time limit for supplying current 106 has expired, where the pre-determined time limit is based on a thermal limit of power switch circuit 118 (see step 622). This time limit is based on a number of factors, including the worst-case power dissipation for power elements implemented by power switch circuit 118, how the power elements are mounted (e.g., directly to a PCB, using heat sinks, fans, etc.), the thermal resistance between the power elements and their corresponding packaging (e.g., the thermal resistance between a die of a MOSFET and the carrier the die is bonded to), etc.

If the pre-determined time limit has not expired, then the execution of method 600 returns to step 616. If the pre-determined time limit has expired, then step 624 is performed. Control circuit 102 terminates drive signal 120 (see step 624). This limits the pulse width of current 106.

Control circuit 102 may then receive a disable command (e.g., enable command 117 may be terminated, see step 626). In response to receiving the disable command, control circuit 102 terminates enable signal 132, which disables the current path from low side 112 of pyrotechnic initiator 108 to ground 130 (see step 628). Control circuit 102 may then receive a disarm command (e.g., arm command 408 may be terminated, see step 630). In response to receiving the disarm command, control circuit 102 terminates arming signal 406, which electrically decouples supply bus 404 from supply rail 122 (see step 632).

In response to firing pyrotechnic initiator 108, method 600 or portions of method 600 may be repeated for additional current channels of current driver 104 to fire additional pyrotechnic initiators (not shown). For instance, control circuit 102 may sequence the firing of multiple NSIs to remove the frangible nuts securing one stage of a launch vehicle to another stage of the launch vehicle, which may occur in response to receiving command 116. Sequencing the firing process may be desirable if supply bus 404 is limited by how much current that supply bus 404 is capable of providing. For instance, supply bus 404 may not be capable of supplying enough current to simultaneously fire multiple pyrotechnic initiators. This problem can be mitigated by sequencing the various current channels of current driver 104 to minimize the current load placed on supply bus 404.

Figure 7:
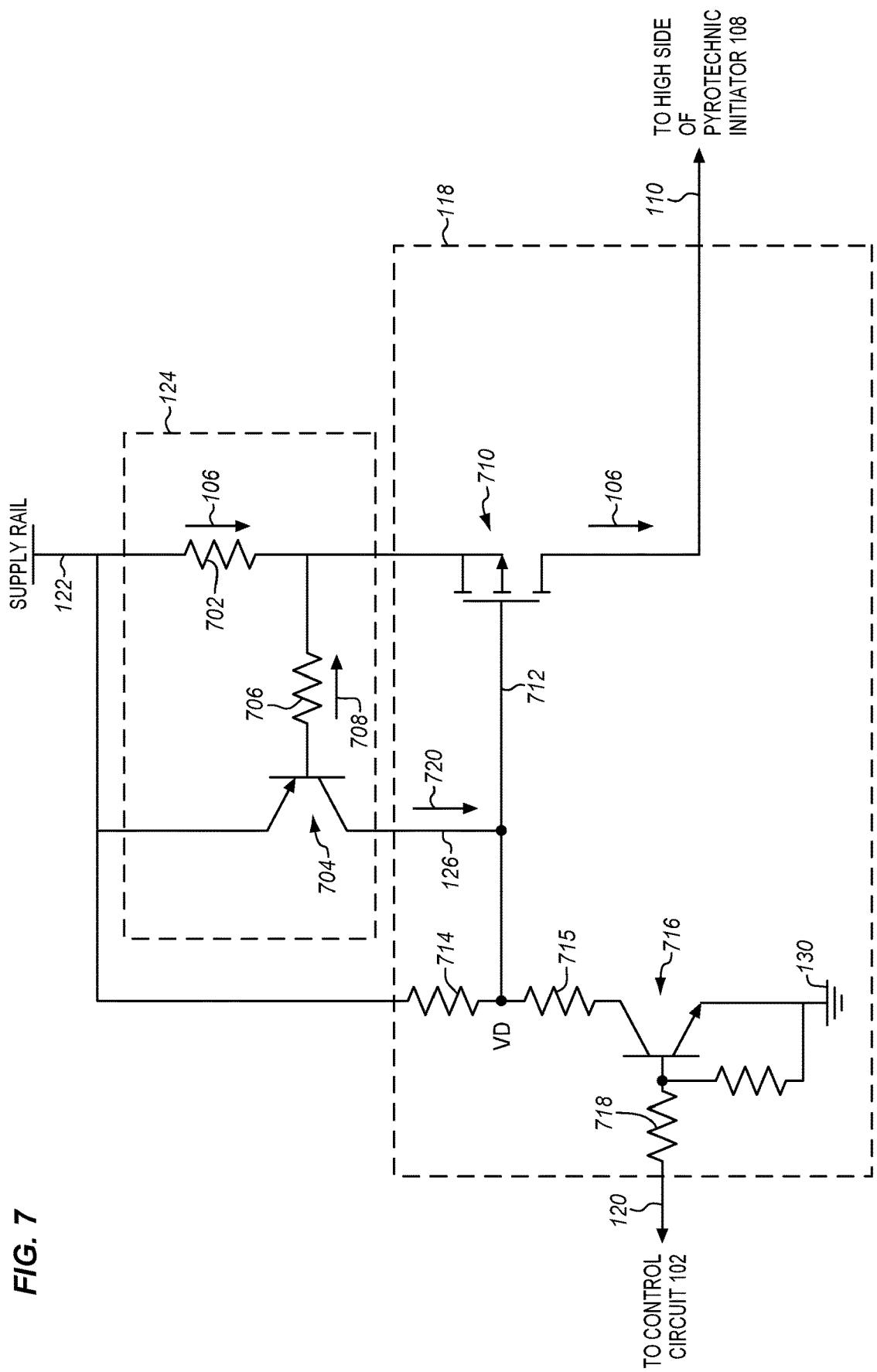
FIG. 7 is a schematic diagram illustrating additional details for the block diagram of FIG. 1 in an illustrative embodiment.

FIG. 7 illustrates one possible implementation for power switch circuit 118 and current sense circuit 124 in an illustrative embodiment. The particular arrangement of circuit elements illustrated in FIG. 7 is provided merely for purposes of discussing one possible implementation. Therefore, neither power switch circuit 118 nor current sense circuit 124 is limited to this particular implementation. Rather, one of ordinary skill in the art will recognize that other circuit elements, arrangements, and circuit designs may be implemented as a matter of design choice.

In this embodiment, current sense circuit 124 includes a sense resistor 702 that generates a voltage differential based on current 106. Current sense circuit 124 in this embodiment also includes a PNP transistor 704 and a base resistor 706. When PNP transistor 704 is active, a base current 708 flows across base resistor 706 in the direction of the arrow.

In this embodiment, power switch circuit 118 includes a P-channel MOSFET 710, which is controlled by a gate drive signal 712. The voltage of gate drive signal 712 varies between the voltage of supply rail 122 and the voltage VD at the voltage divider formed from resistors 714-715. A NPN transistor 716 and a base resistor 718 allow control circuit 102 to vary gate drive signal 712 by turning NPN transistor 716 on and off. When NPN transistor 716 is off (e.g., drive signal 120 is not generated by control circuit 102), resistor 714 pulls gate drive signal 712 to the voltage of supply rail 122. This operates to turn off P-channel MOSFET 710 (e.g., the channel of P-channel MOSFET 710 is in a high impedance state). In this state, current 106 is approximately zero. PNP transistor 704 is also off since the voltage differential across sense resistor 702 is approximately zero.

When control circuit 102 applies drive signal 120 to base resistor 718, NPN transistor 716 turns on and gate drive signal 712 is driven from the voltage of supply rail 122 to the lower voltage of VD based on the voltage divider formed by resistors 714-715. At this point, P-channel MOSFET 710 is in a saturation mode of operation, and the resistance of the channel of P-channel MOSFET 710 is low. Current 106 begins to increase towards the threshold current. Current 106 across sense resistor 702 generates a voltage differential across sense resistor 702, which increases as current 106 increases. At some point, the voltage differential will forward bias PNP transistor 704 (e.g., around 0.7 volts applied to the base-emitter junction of PNP transistor 704, if PNP transistor 704 is a silicon transistor), and base current 708 flows across base resistor 706 in the direction of the arrow. As PNP transistor 704 turns on, the PNP transistor 704 begins to modify gate drive signal 712 applied to P-channel MOSFET 710 by applying a collector current 720 from PNP transistor 704 along signal path 126. Collector current 720 operates to charge gate drive signal 712 towards the voltage of supply rail 122 by overriding the voltage at VD. With current 106 at or near the current threshold, collector current 720 modifies gate drive signal 712 sufficiently to transition P-channel MOSFET 710 from a saturation mode of operation into a linear mode of operation. Generally, the programmed current limit for current 106 is based on the resistance of sense resistor 702, the vbe of PNP transistor 704, the value of base current 708, and the resistance of base resistor 706. At the current limit, the voltage differential across sense resistor 702 will be approximately the vbe of PNP transistor 704 plus the voltage across base resistor 706.

As discussed previously, when P-channel MOSFET 710 operates in the linear mode, varying gate drive signal 712 operates P-channel MOSFET 710 as a variable resistor. This allows current sense circuit 124 to vary the output resistance of power switch circuit 118, which varies the value of current 106. For example, when current 106 is below the threshold current, then the collector current 720 is nearly zero. This allows P-channel MOSFET 710 to operate in a low resistance saturation mode of operation by providing little or no modification to the voltage of gate drive signal 712. As current 106 approaches the threshold current, collector current 720 increases, which provides more modification to gate drive signal 712 and operates to limit current 106 to the threshold current by increasing the resistance across the channel of P-channel MOSFET 710.

Apparatus 100 allows for the implementation of current limited current sources that are capable of providing current pulses to explosive devices such as NSIs. Apparatus 100 may be implemented in a small form factor, which saves weight and space for a variety of applications. Further, apparatus 100 operates over a wide range of input voltages, thereby providing a common platform that may be used in in a variety of systems, such as spacecraft, launch vehicles, etc.

Any of the various elements shown in the figures or described herein may be implemented as hardware, software, firmware, or some combination of these. For example, an element may be implemented as dedicated hardware. Dedicated hardware elements may be referred to as "processors", "controllers", or some similar terminology. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, a network processor, application specific integrated circuit (ASIC) or other circuitry, field programmable gate array (FPGA), read only memory (ROM) for storing software, random access memory (RAM), non-volatile storage, logic, or some other physical hardware component or module.

Also, an element may be implemented as instructions executable by a processor or a computer to perform the functions of the element. Some examples of instructions are software, program code, and firmware. The instructions are operational when executed by the processor to direct the processor to perform the functions of the element. The instructions may be stored on storage devices that are readable by the processor. Some examples of the storage devices are digital or solid-state memories, magnetic storage media such as a magnetic disks and magnetic tapes, hard drives, or optically readable digital data storage media.

Although specific embodiments were described herein, the scope is not limited to those specific embodiments. Rather, the scope is defined by the following claims and any equivalents thereof.

The invention claimed is:

1. An apparatus comprising:
a control circuit; and
a current driver electrically couplable to a pyrotechnic initiator, the current driver comprising:
a power switch circuit electrically coupled to a supply rail that is configured to supply a current to a high side of the pyrotechnic initiator in response to receiving a drive signal from the control circuit, and to vary the current based on the drive signal; and
a current sense circuit configured to monitor the current to the pyrotechnic initiator, and to modify the drive signal applied to the power switch circuit to limit the current to a threshold current,
wherein the control circuit is configured, in response to receiving a command to apply the current to the pyrotechnic initiator, to generate the drive signal, to determine whether a pre-determined time limit has expired for supplying the current, the pre-determined time limit based on a thermal limit of the power switch circuit, and to terminate the drive signal in response to the pre-determined time limit expiring.

2. The apparatus of claim 1, wherein:
the pre-determined time limit is calculated based on the pyrotechnic initiator being a short circuit.

3. The apparatus of claim 1, further comprising:
a plurality of power switch circuits, each associated with a different pyrotechnic initiator and a different drive signal,
wherein the control circuit is configured, in response to receiving the command, to sequence a generation of each of the different drive signals to minimize a current load on the supply rail.

4. The apparatus of claim 1, wherein:
the power switch circuit comprises a Field Effect Transistor (FET) having a drain coupled to the high side of the pyrotechnic initiator, and a gate;
the control circuit is configured to apply the drive signal to the gate of the FET to operate the FET in saturation mode; and
the current sense circuit is configured to modify the drive signal applied to the gate of the FET to operate the FET in linear mode.

5. The apparatus of claim 4, wherein the current sense circuit comprises:
a current sense resistor coupling the supply rail to a source of the FET;
a transistor having an emitter coupled to the supply rail, a collector coupled to the gate of the FET, and a base; and
a base resistor coupling the base of the transistor to the source of the FET.

6. The apparatus of claim 5, wherein:
the current driver includes a plurality of power switch circuits, each of which are associated with a different current sense circuit,
wherein each of the plurality of power switch circuits provides a portion of the current to the high side of the pyrotechnic initiator.

7. The apparatus of claim 1, wherein:
the command comprises a firing command received by the control circuit from an external device to detonate a pyrotechnic device.

8. The apparatus of claim 7, further comprising:
an arming circuit that is configured to couple a supply bus to the supply rail in response to receiving an arming signal from the control circuit,
wherein the control circuit is configured, in response to receiving an arm command from the external device, to generate the arming signal,
wherein the control circuit is configured, in response to receiving a disarm command from the external device, to terminate the arming signal.

9. The apparatus of claim 7, wherein:
the current sense circuit comprises a first current sense circuit;
the threshold current comprises a first threshold current; and
the current driver further comprises:
a second current sense circuit configured to make a determination that the current from a low side of the pyrotechnic initiator to ground exceeds a second threshold current, and to indicate to the control circuit that the current has been applied to the pyrotechnic initiator in response to the determination.

10. The apparatus of claim 7, wherein the current driver further comprises:
an enable switch circuit that is configured to provide a current path from a low side of the pyrotechnic initiator to ground in response to receiving an enable signal from the control circuit,
wherein the control circuit is configured, in response to receiving an enable command from the external device, to generate the enable signal,
wherein the control circuit is configured, in response to receiving a disable command from the external device, to terminate the enable signal.

11. A method for limiting a pulse width of current supplied to a pyrotechnic initiator, the method comprising:
receiving a command to apply a current to the pyrotechnic initiator;
generating a drive signal for a power switch circuit of a current driver in response to receiving the command;
supplying, by the power switch circuit in response to the drive signal, the current from a supply rail to a high side of the pyrotechnic initiator;
monitoring the current to the pyrotechnic initiator;
modifying the drive signal for the power switch circuit to limit the current to a threshold current;
determining whether a pre-determined time limit has expired for supplying the current, the pre-determined time limit based on a thermal limit of the power switch circuit; and
terminating the drive signal in response to the pre-determined time limit expiring.

12. The method of claim 11, wherein:
the pre-determined time limit is based on the pyrotechnic initiator being a short circuit.

13. The method of claim 11, wherein modifying the drive signal comprises:
operating a Field Effect Transistor (FET) supplying the current in linear mode to limit the current to the threshold current.

14. The method of claim 11, further comprising:
receiving an arm command;
electrically coupling a supply bus to the supply rail in response to the arm command;
receiving a disarm command; and
electrically decoupling the supply bus from the supply rail in response to the disarm command.

15. The method of claim 11, wherein:
the threshold current comprises a first threshold current; and
the method further comprises:
determining that the current from a low side of the pyrotechnic initiator to ground exceeds a second threshold current; and
indicating that the current has been applied to the pyrotechnic initiator in response to the determination.

16. The method of claim 11, wherein the method further comprises:
receiving an enable command;
enabling a current path from a low side of the pyrotechnic initiator to ground in response to receiving the enable command;
receiving a disable command; and disabling the current path from the low side of the pyrotechnic initiator to ground in response to receiving the disable command.

17. A pyrotechnic firing device, comprising:
a current driver electrically couplable to a pyrotechnic initiator, the current driver configured to provide a current-limited current to fire the pyrotechnic initiator in response to receiving a drive signal, and to terminate the current-limited current to the pyrotechnic initiator in response to not receiving the drive signal; and
a control circuit configured, in response to receiving a firing command to fire the pyrotechnic initiator, to provide the drive signal to the current driver, to determine whether a pre-determined time limit has expired for supplying the current-limited current, the pre-determined time limit based on a thermal limit of the current driver, and to terminate the drive signal in response to the pre-determined time limit expiring.

18. The pyrotechnic firing device of claim 17, further comprising:
an arming circuit that is configured to provide electrical power to the current driver in response to receiving an arming signal, and to terminate the electrical power to the current driver in response to not receiving the arming signal,
wherein the control circuit is configured, in response to receiving an arm command, to generate the arming signal,
wherein the control circuit is configured, in response to receiving a disarm command, to terminate the arming signal.

19. The pyrotechnic firing device of claim 17, wherein the current driver comprises:
a power switch circuit that is configured to provide the current-limited current to a high side of the pyrotechnic initiator in response to receiving the drive signal from the control circuit, and to vary the current-limited current based on the drive signal; and
a current sense circuit configured to determine whether the current-limited current exceeds a threshold current, and to modify the drive signal applied to the power switch circuit to limit the current-limited current to the threshold current.

20. The pyrotechnic firing device of claim 17, wherein the current driver further comprises:
an enable switch circuit that is configured to provide a current path from a low side of the pyrotechnic initiator to ground in response to receiving an enable signal from the control circuit, and to terminate the current path from the low side of the pyrotechnic initiator to ground in response to not receiving the enable signal from the control circuit,
wherein the control circuit is configured, in response to receiving an enable command, to generate the enable signal,
wherein the control circuit is configured, in response to receiving a disable command, to terminate the enable signal.

* * * * *